United States Patent [19]

Rubner et al.

[11] 4,045,223

[45] Aug. 30, 1977

[54] METHOD FOR THE PREPARATION OF LAYER STRUCTURES

[75] Inventors: Roland Rubner, Rottenbach near Forchheim; Wolfgang Kleeberg; Eberhard Kühn, both of Erlangen, all of Germany

[73] Assignee: Siemens Aktiengesellschaft, Munich, Germany

[21] Appl. No.: 598,651

[22] Filed: July 24, 1975

[30] Foreign Application Priority Data

Aug. 2, 1974 Germany ............................ 2437368

[51] Int. Cl.² ............................................. G03C 5/00
[52] U.S. Cl. .................................. 96/35.1; 96/115 P; 96/115 R; 204/159.14
[58] Field of Search ................ 96/35.1, 115 P, 115 R; 260/468 J, 47 CE; 204/159.14

[56] References Cited

U.S. PATENT DOCUMENTS

| 3,475,176 | 10/1969 | Rauner ............................. 96/115 R |
| 3,650,746 | 3/1972 | Bailey et al. ........................ 96/35.1 |
| 3,753,720 | 8/1973 | Kloczenski et al. .................. 96/35.1 |
| 3,801,638 | 4/1974 | Cerwonka ......................... 96/115 P |
| 3,847,767 | 11/1974 | Kloczewski ....................... 96/115 P |
| 3,858,510 | 11/1975 | Kai et al. .......................... 96/115 P |
| 3,957,512 | 5/1976 | Kleeberg et al. ..................... 96/35.1 |

*Primary Examiner*—Edward C. Kimlin
*Attorney, Agent, or Firm*—Kenyon & Kenyon, Reilly, Carr & Chapin

[57] ABSTRACT

The invention provides a method for the preparation of solvent soluble, highly heat-resistant layered structures, using radiation-sensitive, soluble, preliminary polymers. According to the invention, soluble preliminary polymers are used which are prepared in a hexamethyl phosphoric acid triamide solution and which comprise polycondensation products of primary diamines with bicyclo[2.2.2.]octene-7-tetra carboxylic acid-2,3,5,6-diester-bis-acid chlorides wherein the ester groups are in the orthoposition with respect to the acid chloride groups and contain radiation-reactive radicals. Optionally di-ortho-tetracarboxylic acid-diester-bis-acid chlorides and/or di-ortho-tetracarboxylic acid-bis-anhydrides, carrying radiation-reactive ester radicals, can also be used in addition to the bicyclo[2.2.2.]octene-7-tetra carboxylic acid-2,3,5,6-diester-bis-acid chlorides.

14 Claims, No Drawings

METHOD FOR THE PREPARATION OF LAYER STRUCTURES

BACKGROUND OF THE INVENTION

The present invention is concerned with a method for the preparation of organic-solvent soluble, highly heat-resistant layered structures by applying radiation-sensitive, soluble preliminary polymers to a substrate in the form of a layer or a foil; irradiating the radiation-sensitive layer or foil through negative patterns; removing the unirradiated layer or foil parts and annealing the relief structures thus obtained.

The preparation of thermally stable polymide structures from soluble, bichromate-sensitized preliminary polymers is known in the art (cf. Polymer Engineering and Science, vol. 11, pages 426 to 430 (1971). Their use as negative photoresists is made much more difficult by the fact that the solutions and films of these photosensitized preliminary polymers are very unstable and accordingly must be processed immediately after preparation. In addition, the final removal of the resist from the substrate without damaging the latter is difficult, since the polyimides obtained after exposure, developing and annealing usually only dissolve in strong acid or alkaline media, but not in organic solvents.

It is further known that relief structures can be produced from soluble, light-sensitive preliminary stages of polyimides by means of a photoresist technique and then converting them into polyimides by annealing, (see German Auslegeschrift 1,764,977). The limitations as to storage stability of the preliminary polymers and to the ability to remove the polyimides apply here equally, and in addition, only limited resolution and moderate edge definition can be obtained in dissolving the film portions not covered by the photoresist.

SUMMARY OF THE INVENTION

It is the object of this invention to prepare highly heat-resistant structures with sharp contours, particularly photoresists, which are soluble in inert organic solvents and can be removed from the substrate by dissolution after they have fulfilled their function.

According to the invention, this problem is solved by using as soluble preliminary polymers, polycondensation products of primary diamines with bicyclo[2.2.2.]octene-7-tetracarboxlyic acid-2,3,5,6-diester-bis-acid chlorides wherein the ester groups contain radiation-reactive radicals or optionally, with further aromatic di-ortho-tetracarboxylic acid diester-bis-acid chlorides and/or aromatic di-ortho-tetracarboxylic acid-bis-anhydrides wherein the ester groups contain radiation-reactive radicals arranged in ortho position with respect to the acid chloride groups. The soluble preliminary polymers are prepared in a hexamethyl phosphoric acid triamide solution. Each ester group of the above-mentioned compounds can be represented by the formula

wherein R', the radiation-reactive radical is represented by the formulae:

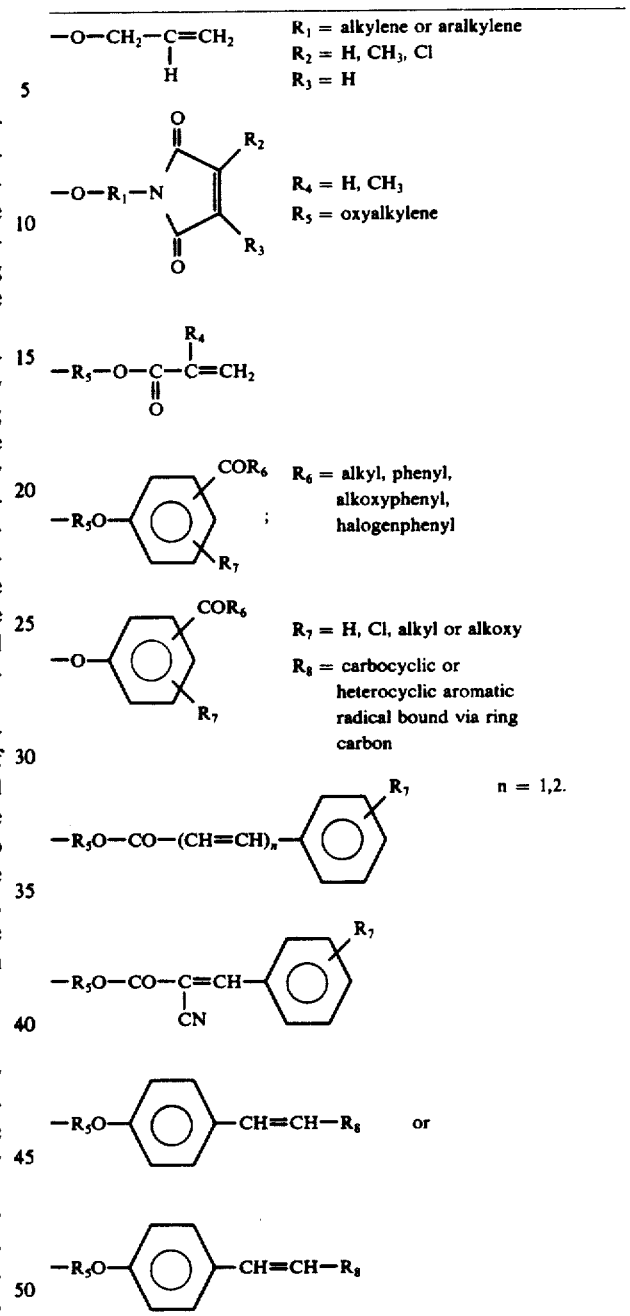

DETAILED DESCRIPTION OF THE PREFERRED EMBODIMENTS

It is an important advantage of the method according to the invention that through the use of hexamethyl phosphoric acid triamide as the solvent, a particularly simple and economical preparation of the solvent soluble preliminary polymers in the form of a "single pot" reaction is made possible.

Particularly well suited for the present method are aromatic di-ortho-tetracarboxylic acid diester-bis-acid chlorides and aromatic di-ortho-tetracarboxylic acid-bis-anhydrides which are derived from pyromellitic acid or benzophenone tetracarboxylic acid. As the diamines, aromatic diamines such as diaminodiphenyl methane, diaminodiphenyl sulfide, diaminodiphenyl ether are particularly well suited.

Highly radiation-reactive radicals such as oxyallyl, N-oxyalkyl- or N-oxyalkylarylmaleimide and β-oxyethylmeth-acrylate or -acrylate radicals are particularly useful in the invention.

For increasing the cross-linking speed, commonly used photo initiators and/or sensitizers can be employed, see for example Industrie Chimique Belge, vol. 24, pages 739 to 64 (1959) or Light-Sensitive Systems by J. Kosar, John Wiley & Sons, Inc., New York 1965, pages 143 to 46 and 160 to 88. Highly suited sensitizers and/or initiators are, Michler's ketone and/or benzoin ether, 2-tert-butyl-9,10-anthraquinone, 1,2-benz-9,10-anthraquinone, 4,4'-bis(diethylamino) benzophenone.

In addition, the soluble preliminary polymers can be combined with further radiation-sensitive, copolymerizable compounds. Well suited are, for instance, compounds which contain one or several N-substituted maleimide groups.

One advantage of the soluble preliminary polymers used according to the invention is that upon irradiation, a partial crosslinking of the radiation-reactive radicals leads to sufficient insolubility of the irradiated film or foil parts and makes the preparation of relief structures with sharply defined edges possible. Subsequently, the layered structures are then converted in a simple annealing step into highly heat-resistant, soluble polyimides by a cyclization reaction. The edge sharpness and the resolution of the reief structures remain unchanged.

It is very advantageous, particularly for the application pf the polyimide layered structures prepared in accordance with the invention as highly heat-resistant photoresists, that they have excellent mechanical properties and adhesion to different types of substrates, are resistant against acid and alkaline etching or electroplating baths but are soluble in inert organic solvents and can accordingly be removed extremely gently by simple dissolution after their purpose is fulfilled, without damage to the substrate. Suitable inert organic solvents are dimethyl formamide, dimethyl acetamide, N-methyl pyrrolidone, and hexamethyl phosphoric acid triamide.

The present method provides a simple and reliable preparation of highly temperature-resistant and if required miniaturized, layered structures with sharp-edge definition and good resist properties. The adhesion of the layered patterns produced on different substrates can be improved still further by commonly used adhesive agents such as, the organic silicon compounds, vinyltriethoxy silane, vinyltrimethoxy silane, and γ-methacryloxy-propyl-trimethoxy silane.

The method according to the invention can be used to advantage in the most diverse technical fields. It is particularly well suited for the preparation of intermediary, easily removable protective-layer structures and masks for evaporation, sputtering, implantation and diffusion ion etching and other etching processes and for electroplating processes, particularly in the field of electrical engineering such as, for instance in the manufacture of components and circuits.

In German Offenlegungsschrift 2,308,830, a method for the preparation of relief structures consisting of highly heat-resistant polymers is described, e.g., of polyimides with aromatic or heterocyclic bases. (cf. page 23, claim 1, as well as page 5. paragraph 2). However, such polyimides are insoluble in inert, organic solvents. The preparation of photoreactive preliminary polymers for producing soluble polyimide relief structures with a partial bicyclic base analogous to the proposed method, however, would be expensive as the different reaction steps would have to be carried out separately, as Example 1 below shows.

EXAMPLE 1

Preparation of the Soluble, Preliminary Polymer (Process cycle in accordance with German Offenlegungsschrift 2,308,830)

Exactly 24.4 parts by weight bicyclo[2.2.2.]octene-7-tetracarboxylic acid-2,3,5,6-dianhydride were heated with 500 parts by volume of allyl alcohol and 500 parts by volume dioxane with refluxing for 1 hour after which the solvent and the excess allyl alcohol were distilled off in a water-jet vacuum. According to the IR spectrum ($\nu$carboxylic acid at 3.75-4$\mu$m, $\nu$ester at 5.8$\mu$m, $\nu$allyl at 6.1$\mu$m and 10.1$\mu$m) and the acid number, the residue consisted of bicyclo[2.2.2.]octene-7-tetra-carboxylic acid-2,3,5,6-diallyl esters, compounds not described to date. It was dissolved in 150 parts by volume methylene chloride and 16 parts by weight pyridine, and 25 parts by weight thionyl chloride were slowly added by means of a dropper to the solution at −10° C while stirring. Stirring was then continued at −10° C for an hour and the methylene chloride was drawn off under vacuum at this temperature. The bicyclo[2.2.2.] octene-7-tetra-carboxylic acid-2,3,5,6-diallylester-bis-acid chlorides), compounds not described to date, which remained as the residue, were characterized by means of the IR spectrum ($\nu$acid chloride at 5.5$\mu$m, $\nu$ester at 5.8$\mu$m, $\nu$allyl at 6.1 and 10.1$\mu$m).

Exactly 2.2 parts by weight pyromellitic acid dianhydride were shaken with 10 parts by volume allyl alcohol in the presence of 0.01 parts by weight of p,p'-bis(dimethylamino)-diphenyl methane at room temperature for 4 days; then, excess allyl alcohol was distilled of in a water-jet vacuum. The residue was allowed to stand with 5 parts by weight thionyl chloride and 0.1 part by volume dimethyl formamide at room temperature for 1 hour and then boiled for 3 hours while refluxing. Excess thionyl chloride was distilled off in a water-jet vacuum. The residue was dissolved in 60 parts by volume dimethyl acetamide, cooled to −10° C and then mixed with a solution, −10° C cold, of the above bicyclo[2.2.2.]octene-7-tetracarboxylic acid-2,3,5,6-diallylester-bis-acid chloride in 130 ml parts by volume of dimethyl acetamide.

Into this mixture was added drop-wise at −10° C with stirring, a solution of 21.8 parts by weight 4,4'-diaminodiphenyl methane in 130 parts by volume dimethyl acetamide. Stirring was continued at room temperature for 1 hour. The soluble preliminary polymer was then precipitated by adding the solution drop-wise to 4000 parts by volume of water followed by washing with water and ethanol.

Preparation of Relief Structures

About 5 parts by weight of the preliminary polymer, 0.5 parts by weight of N-phenyl maleimide and 0.05 parts by weight of Michler's ketone were dissolved in 20 parts by volume of dimethyl formamide. The solution was then filtered and centrifuged on aluminum foil to form uniform films, which after evaporation of the solvent were 3 $\mu$m thick. The films were irradiated with a 500-W very-high-pressure mercury lamp at a distance of 23 cm through a contact negative for 3 minutes and developed for 10 sec in γ-butyrolactone. A resolution of better than 20 μm was obtained with good edge definition. The samples obtained were annealed for 20 minutes at 300° C in nitrogen. Resolution and edge definition remained unchanged by this process. The relief structures which exhibited excellent thermal, mechanical and electrical properties characteristic of polyimides, were resistant to aqueous etching and electroplating baths, but could be removed from the aluminum substrate simply by dissolution in dimethyl formamide. The solubility of the relief structures in dimethyl formamide was preserved also after annealing for 15 min at 350° C in a vacuum and after annealing for 5 minutes at 400° C in nitrogen. The IR spectrum of the annealed samples showed the bands at 5,5μm typical for the imide structure.

EXAMPLE 2

Preparation of the Soluble Preliminary Polymer Stage (Use of hexamethylphosphoric acid triamide as solvent)

Exactly 24.4 parts by weight bicyclo[2.2.2.]octene-7-tetracarboxylic acid-2,3,5,6-dianhydride and 2.2 parts by weight pyromellitic acid anhydride dissolved in 170 parts by volume hexamethyl phosphoric acid triamide and 20 parts by volume pyridine were reacted while cooling with ice and stirring, with 12.8 parts by weight of allyl alcohol added dropwise and further stirred at room temperature for 4 days. To the solution were subsequently added dropwise at −10° C, 27.5 parts by weight thionyl chloride and stirring was continued for 1 hour. Then, a solution of 23.7 parts by weight 4,4'-diaminodiphenyl sulfide in 170 parts by volume dimethyl acetamide was dropwise added, and finally stirring was continued without cooling for 1 hour.

The soluble preliminary polymer stage was precipitated by adding the solution drop wise to 4000 parts by volume of water and washed with water and ethanol.

Preparation of Relief Structures

About 5 parts by weight of the preliminary polymer stage, 0.5 parts by weight of N-phenyl maleimide and 0.05 parts by weight of Michler's ketone were dissolved in 15 parts by volume of dimethylformamide. Then, the solution was filtered and centrifuged on copper foil to form uniform films, which after evaporation of the solvent were 5 μm thick. The films were irradiated for 4 min. as described in Example b 1, and developed for 15 sec in γ-butyrolactone. A resolution better than 30 μm was obtained with good edge definition. The samples obtained were annealed for 20 minutes at 300° C in nitrogen. In the process, the resolution and the edge definition remained unchanged, and the relief structures then exhibited excellent thermal, mechanical and electrical properties of polyimides, were resistant to aqueous etching and eletroplating baths, but could be removed from the copper substrate simply by dissolution in dimethyl formamide. The IR spectrum showed the bands at 5.6 μm typical for the imide structure.

We claim:

1. In a method for the preparation of highly heat-resistant layered structures soluble in organic solvents comprising:
   a. applying a coating of a radiation-sensitive, preliminary polymer to a substrate in the form of a layer or a foil;
   b. irradiating the radiation sensitive layer or foil through negative patterns;
   c. removing the non-irradiated layer or foil to form a relief structure; and
   d. annealing said relief structure;

the improvement which comprises using as said radiation sensitive preliminary polymer a solvent soluble preliminary polymer comprising a polycondensation product of a primary diamine with bicyclo[2.2.2.]octene-7-tetracarboxylic acid-2,3,5,6-diester-bis-acid chloride or with a mixture of said bicyclo[2.2.2.]octene with a compound selected from the group consisting of an aromatic di-ortho-tetracarboxylic acid diester-bis-acid chloride, an aromatic di-ortho-tetracarboxylic acid-bis-anhydride and mixtures thereof; wherein the ester groups of said bicyclo[2.2.2.]octene-7-tetra-carboxylic acid-2,3,5,6-diester-bis-acid chloride and said di-ortho-tetracarboxylic acid diester-bis-acid chloride are in ortho position with respect to said acid chloride groups, said ester groups containing radiation reactive radicals selected from the group consisting of:

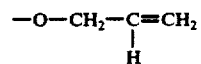

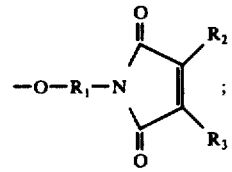

wherein $R_1$ is alkylene or aralkylene; $R_2$ is hydrogen, $CH_3$ or Cl and $R_3$ is hydrogen;

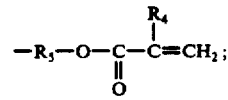

wherein $R_4$ is hydrogen or methyl; and $R_5$ is oxyalkylene;

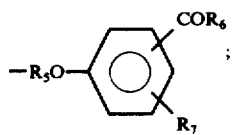

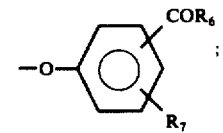

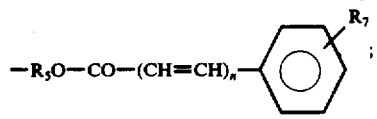

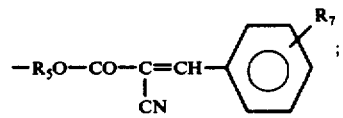

wherein $R_6$ is alkyl, phenyl, alkoxy phenyl or halogenated phenyl; $n$ is 1 or 2; and $R_7$ is H, Cl, alkyl or alkoxy;

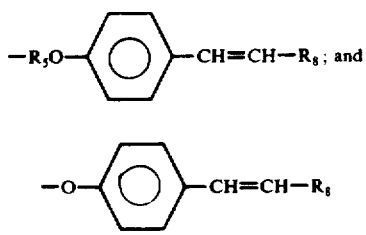

wherein R₈ is a carbocyclic or heterocyclic aromatic radical bound via a ring carbon atom, and wherein said radiation-sensitive preliminary polymer is prepared in a hexamethyl phosphoric acid triamide solution.

2. The polycondensation product of claim 1 wherein the di-ortho-tetracarboxylic acid diester-bis-acid chloride is selected from the group consisting of pyromellitic acid diester-bis-acid chloride, benzophenone tetra-carboxylic acid diester-bis-acid chloride and mixtures thereof.

3. The polycondensation product of claim 2 wherein the pyromellitic acid diester-bis-acid chloride comprises from 5 to 10 mole percent based on the amount of the bicyclo[2.2.2.]-octenetetracarboxylic acid diester-bis-acid chloride.

4. The polycondensation product of claim 1 wherein the di-ortho-tetracarboxylic acid-bis-anhydride is selected from the group consisting of pyromellitic acid bis-anhydride, benzophenone tetracarboxylic acid-bis-anhydride and mixtures thereof.

5. The polycondensation product of claim 1 wherein the diamine is an aromatic diamine.

6. The polycondensation product of claim 5 wherein the aromatic diamine is p,p′-diaminodiphenyl methane.

7. The polycondensation product of claim 1 wherein the radiation-reactive radical is an oxyallyl radical.

8. The polycondensation product of claim 1 wherein the radiation-reactive radical is an N-oxyalkyl- or N-oxyalkyl-arylmaleimide radical based on N-hydroxyalkyl or N-hydroxyalkyl-arylmaleimide.

9. The polycondensation product of claim 1 wherein the radiation-reactive radical is a β-oxyethylmethacrylate or -acrylate radical based on β-hydroxyethylmethacrylate or -acrylate respectively.

10. The soluble preliminary polymer of claim 1 wherein said soluble preliminary polymer is used together with a radiation-sensitive copolymerizable compound.

11. The preliminary polymer of claim 10 wherein the soluble preliminary polymer is used together with a compound which contains one or several N-substituted maleimide groups.

12. The preliminary polymer of claim 1 wherein the soluble preliminary polymer and radiation-sensitive copolymerizable compounds are used together with photo initiators or photo-sensitizers.

13. The preliminary polymer of claim 12 wherein 4,4′-bis(diethylamino)-benzophenone, Michler's ketone, benzoin ether and mixtures thereof are used as the photoinitiators or sensitizers.

14. The method of claim 1 wherein the highly heat resistant layered structures are applied in making electrical components and circuits.

* * * * *